United States Patent

Yu et al.

[11] Patent Number: 5,795,833
[45] Date of Patent: Aug. 18, 1998

[54] METHOD FOR FABRICATING PASSIVATION LAYERS OVER METAL LINES

[75] Inventors: Chen-Hua Yu, Hsin-Chu; Yao-Yi Cheng, Taipei, both of Taiwan

[73] Assignee: Taiwan Semiconductor Manufacturing Company, Ltd., Hsin-Chu, Taiwan

[21] Appl. No.: 691,080

[22] Filed: Aug. 1, 1996

[51] Int. Cl.[6] .................. H05H 1/24; B05D 3/14; H01L 21/02

[52] U.S. Cl. .......... 438/763; 438/789; 438/792; 438/780; 427/579

[58] Field of Search .................. 437/238, 241; 427/579, 563, 255.2, 255.3, 763, 789, 788, 792, 793, 780

[56] References Cited

U.S. PATENT DOCUMENTS

| | | | |
|---|---|---|---|
| 4,692,786 | 9/1987 | Lindenfelser | 438/763 |
| 4,978,420 | 12/1990 | Bach | 156/643 |
| 4,992,306 | 2/1991 | Hochberg et al. | 427/255.3 |
| 5,040,046 | 8/1991 | Chhabra et al. | 427/579 |
| 5,103,276 | 4/1992 | Shen et al. | 357/23.6 |
| 5,271,972 | 12/1993 | Kwok et al. | 427/579 |
| 5,308,795 | 5/1994 | Hawley et al. | 437/195 |
| 5,310,692 | 5/1994 | Chan et al. | 437/41 |
| 5,356,722 | 10/1994 | Nguyen et al. | 427/577 |
| 5,393,702 | 2/1995 | Yang et al. | 437/195 |
| 5,397,748 | 3/1995 | Watanabe et al. | 438/763 |
| 5,399,389 | 3/1995 | Hieber et al. | 427/579 |
| 5,399,533 | 3/1995 | Pramanik et al. | 437/228 |
| 5,572,050 | 11/1996 | Cohen | 257/209 |
| 5,572,062 | 11/1996 | Iranmanesh | 257/530 |

FOREIGN PATENT DOCUMENTS 462730  12/1991  European Pat. Off. .......... 427/579

*Primary Examiner*—Marianne Padgett
*Attorney, Agent, or Firm*—George O. Saile; Stephen B. Ackerman; William J. Stoffel

[57] ABSTRACT

The present invention provides a method of fabricating passivation layers over closely spaced metal lines on a substrate. More particularly, the invention forms a three layer sandwich of passivation layers comprised of (1) a first thin plasma enhance silicon nitride (PE-SiN) layer; (2) a silicon oxide layer; and (3) a second silicon nitride layer. The method begins by forming closely spaced metal lines 20 over a substrate surface. A first silicon nitride layer 24 is formed using a low powered plasma enhanced chemical vapor deposition process, over the metal lines 20 and the substrate surface. A silicon oxide layer 28 is then formed over the first silicon nitride layer. A second nitride layer 32 is formed, using a plasma enhanced chemical vapor deposition process, over the silicon oxide layer 28. The method further includes forming an insulating layer 36 over the second nitride layer. The passivation layers of the invention is preferably formed over the top metal layer.

4 Claims, 1 Drawing Sheet

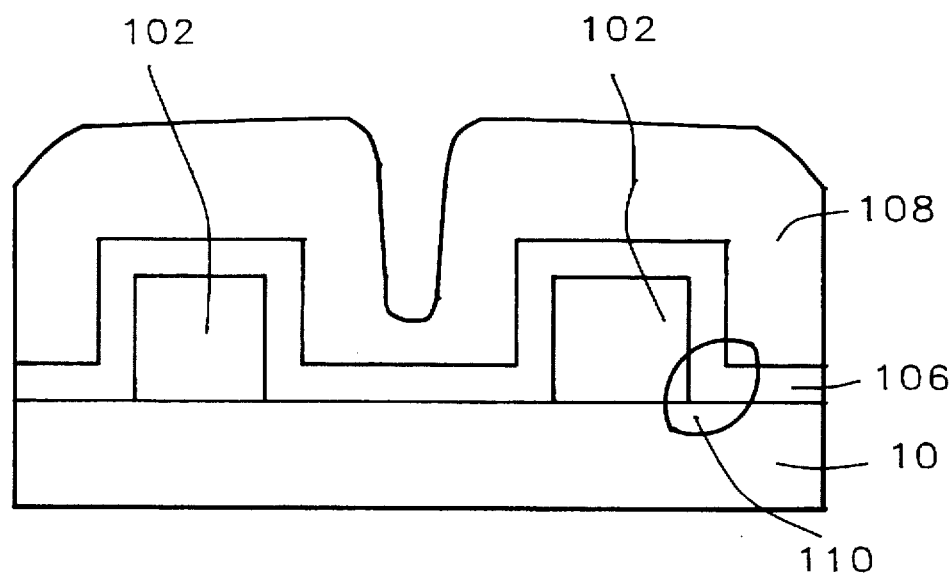
*FIG. 1 - Prior Art*
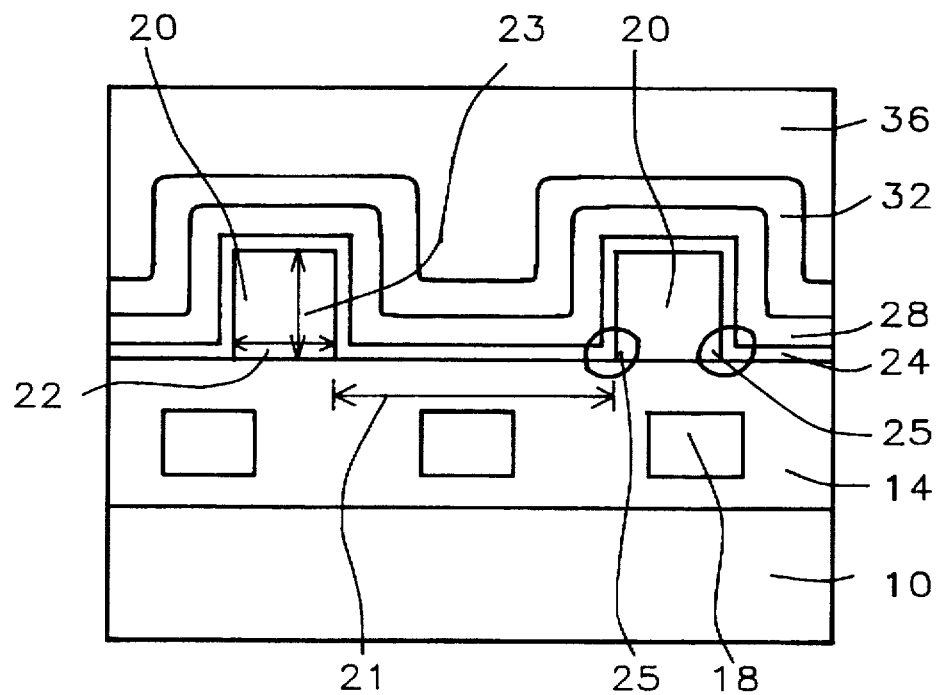
*FIG. 2*

METHOD FOR FABRICATING PASSIVATION LAYERS OVER METAL LINES

BACKGROUND OF INVENTION

1. Field of the Invention

This invention relates generally to the fabrication of passivation layers over metal lines in a semiconductor device.

2. Description of the Prior Art

In the conventional formation of conductive layers in an integrated circuit, a metal layer is deposited and patterned by conventional lithography and etching techniques to form metal lines/patterns, thus creating an uneven surface. Then a layer of insulating material, such as silicon oxide, is applied over the metal lines to electrically insulate the metal lines from each other and to permit the formation of further patterned layers thereover. Also, an epoxy molding layer or a polyimide (PI) layer is formed over a top metal layer and the insulating layer.

It is often desirable for the insulating layer or passivation layer be so formed that the upper surface of the insulating layer is planar over an extended region, irrespective of whether individual portions of the upper surface overlie metal lines or contacts or the spaces between such lines/contacts. The formation of such an insulating layer having a planar upper surface is referred to as planarization.

FIG. 1 shows a typical structure for a metal layer of a semiconductor device. A metal line 102 is formed over a substrate 100. A first insulating layer 106 is formed over the metal layer 102. A second insulting layer 108 is formed over the first insulating layer 106. However, this configuration has several drawbacks. As the metal line spacing is decreased, the first insulating layer 106 does not evenly cover the corners 110 of the metal lines 102. This leads to cracks or thin spots at the metal corners 110 that result from the poor step coverage. The poor step coverage leads to moisture leakage corrosion, yield problems and reliability problems. Moreover, the thick second insulating layer 108 often forms "key holes" when the spacing between the metal lines is reduced. In addition, stress is created between the metal line 102 and the overlying insulating layers, especially the thick second insulating layer 108. This stress leads to reliability problems.

Many practitioners have attempted to solve these problems. U.S. Pat. No. 5,399,533 (Pramanik et al.) teaches a method for planarizing insulating layers over a metal pattern. The process comprises: (a) forming a metal pattern, (b) forming a silicon nitride (SiN) layer, (c) forming a spin-on-glass (SOG) layer; (c) etching back the SOG and SiN layers, and (d) forming an oxide layer thereover. U.S. Pat. No. 5,310,692 (Chan et al.) teaches a method of forming a MOSFET structure with a planar surface. Chan shows a structure of a metal line - SiN layer - spin-on-glass (SOG) layer. U.S. Pat. No. 5,393,702 (Yang) teaches a structure of: a metal line covered by an oxide layer, a SOG layer, oxide layer, and a nitride layer.

Therefore, there is a need for a passivation layer structure which will provide adequate metal line step coverage to ensure that the metal lines are covered with a moisture proof barrier. Also, there is a need for a passivation layer structure which will provide a stress buffer between the metal lines and the overlying insulating layers.

SUMMARY OF THE INVENTION

It is an object of the present invention to provide a structure of passivation layers over metal lines that will provide a moisture proof barrier and good step coverage.

It is an object of the present invention to provide a structure of passivation layers that will reduce the stress between the metal lines and the passivation layers.

To accomplish the above objectives, the present invention provides a method of fabrication of passivation layers over closely spaced metal lines on a substrate. More particularly, the invention forms a three passivation layer sandwich structure comprised of (1) a first thin plasma enhanced silicon nitride (PE-SN) layer; (2) a silicon oxide (Ox) layer; and (3) a second silicon nitride layer (SiN).

The method begins by forming closely spaced metal lines 20 over a substrate surface. A first silicon nitride layer 24 is formed using a low powered plasma enhanced chemical vapor deposition (PECVD) process, over the metal lines 20 and the substrate surface. The first silicon nitride layer preferably has a thickness in a range of about 900 and 1000 Å. A silicon oxide layer 28 is then formed over the first silicon nitride layer. The silicon oxide layer 28 preferably has a thickness in a range of between about 4000 and 9000 Å. A second nitride layer 32 is formed, using a plasma enhanced chemical vapor deposition process, over the silicon oxide layer 28. The second nitride layer preferably has a thickness in a range of between about 4000 and 7000 Å. An insulating layer can be formed over the second nitride layer.

The first silicon nitride layer of the invention forms a good moisture barrier at the lower corners 25 near the bottom of the metal lines 20 because of the conformal nature of the plasma enhanced SiN process and because the first SiN layer is thin—less than about 1000 Å thick. Also, the first PE-SiN layer 24 does not induce much stress since the layer is thin. The good moisture barrier properties and step coverage of first PE-SiN layer 24 eliminate corrosion of the metal layers. The PE-SiN process and the thin layer 24 also provide good step coverage which ensures that a good moisture proof seal is formed at the corners of the metal lines (e.g., 10). In addition, the silicon oxide layer 28 provides a stress buffer between the underlying metal 20 and first silicon nitride layer 24 and for the next overlying layer SiN layer 32. This stress buffer maintains the good moisture barrier over the metal lines and increases the reliability.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 is a cross sectional view for illustrating a passivation layer structure of the prior art.

FIG. 2 is a cross sectional view for illustrating a method of the fabricating the passivation layer structure according to the present invention.

DETAILED DESCRIPTION OF THE PREFERRED EMBODIMENTS

The present invention will be described in detail with reference to the accompanying drawings. The present invention provides a method of fabrication of passivation layers over closely spaced metal lines over a semiconductor structure. More particularly, in a preferred embodiment, the invention forms a three layer sandwich of passivation layers comprised of: (1) first thin silicon nitride (SN) layer formed by plasma enhanced chemical vapor deposition (PECVD), (2) a silicon oxide layer; and (3) a second silicon nitride layer formed by PECVD.

Substrate 10 is understood to possibly include a semiconductor wafer, active and passive devices formed within the wafer and layers formed on the wafer surface. The term "substrate" is mean to include devices formed within a semiconductor wafer and layers overlying the wafer, such as insulating layers, (e.g., $SiO_2$) and conductive layers (e.g., polysilicon and metal). The term "substrate surface" is meant to include the upper most exposed layers over the semiconductor wafer, such as a silicon surface, an insulating layer and conductive lines. The substrate surface can be formed by processes and layers formed over a wafer.

Referring to FIG. 2, closely spaced metal lines 20 are formed over a semiconductor structure. The semiconductor structure can comprise all layers and devices formed over a semiconductor wafer. The layers can be insulating and conductive layers. For example, the layers 18 can represent gate electrodes or first metal layers. Insulating layer 14 can represent the insulating layers formed over a wafer or the insulating layers formed over metal lines (e.g., 18). The metal lines can be any conductive lines over the wafer or substrate 10, including the first level metal, second level metal, etc. top level metal. The metal lines 20 are preferably composed of tungsten, polycide, and aluminum alloys, such as, Al:Si, Al:SI:Cu, and Al:Cu. The metal lines are preferably the top (e.g., upper most, highest) metal lines on the chip. The metal lines 20 for a top metal layer are more preferably composed of an aluminum alloy, such as Al:Cu.

The metal lines are preferably closely spaced. The metal lines can have height 23 in a range of about 0.4 and 0.8 µm, a width 22 preferably in a range of about 0.5 and 1.5 µm and as low as about 0.5 µm with current technology tools, and a spacing 21 in a range of about 0.5 and 1.0 µm and a spacing as low as 0.5 with current technology tools.

Next, a first silicon nitride layer 24, is formed over the metal lines 20 and the substrate surface. The first silicon nitride (SiN) layer 24 is preferably formed using a low powered plasma enhanced chemical vapor deposition (PECVD) process. A first silicon nitride layer 24 composed of a plasma enhanced silicon nitride (PE-SiN) layer can be formed by reacting silane and ammonia in an argon plasma or by reacting silane and ammonia in a nitrogen discharge. Preferably, the plasma enhanced silicon nitride layer (PE-SN) is formed in an argon plasma. The flow rates of silane are between 200 and 300 sccm and of ammonia between 50 and 120 sccm and $N_2$ flow rate of between about 3000 and 4000 sccm. The PE-SN is deposited at a pressure between 4.0 and 6.0 Torr. The PE-SN layer 24 can be deposited at a temperature between 380° and 420° C. The PE-SN is deposited at a power of between 680 and 740 watts. The electrode gap spacing is between 580 and 620 mils. Conventional plasma deposition equipment can be used, such as, an AMAT depositor, model P-5000 by Applied Materials company.

Furthermore, a protective layer 24 composed of PE-SiN is preferably be formed by a plasma enhance deposition of Silicon nitride at a pressure of about 4.5 torrs, a rf power of about 720 watts, at a temperature of about 400° C., with an electrode spacing of about 600 mils, with a $SiH_4$ flow of about 275 sccm, a $NH_3$ flow rate of 100 sccm, and a $N_2$ flow rate of about 3700 sccm. The first silicon nitride layer 24 preferably has a thickness in a range of about 900 and 1000 Å.

The first silicon nitride layer forms a good moisture barrier at the lower corners 25 near the bottom of the metal lines 20 because of the conformal nature of the plasma enhanced process and because the SiN layer is thin—under about 1000 Å thick. The good moisture barrier properties of layer 24 eliminate corrosion of the metal layers. The PE-SiN process and the thin layer 24 also provide good step coverage which ensures that a good moisture proof seal is formed at the corners of the metal lines (e.g., 10). Also, the PE-SiN layer 24 does not induce much stress since the layer 24 is thin.

Next, a silicon oxide layer 28 is formed over the first silicon nitride layer. The silicon oxide layer 28 preferably has a thickness in a range of between about 4000 and 9000 Å and is optimized based on the spacing of the underlying metal layer. The thickness of silicon oxide layer 28 is very important because it minimizes the stress between the metal lines 20 and the passivation layers 24 32 while maintaining good step coverage and an integrate moisture proof barrier.

The silicon oxide layer 28 is preferably formed using a process selected from the group consisting of plasma enhanced chemical vapor deposition (PECVD), atmospheric, pressure chemical vapor deposition (APCVD), SACVD (sub atmospheric pressure CVD), spin-on-glass (SOG), and low temperature oxidation (LTO). The silicon oxide layer 28 is more preferably formed using a PECVD process and more preferably formed of PE-TEOS for its superior step coverage.

A silicon oxide layer 32 can be a plasma enhanced silicon oxide (PE-OX) layer which can be formed by reacting silane and nitrous oxide. The flow rates of silane are between about 37 and 120 sccm and a flow rate of nitrous oxide between 1500 and 2000 sccm. The PE-OX layer 32 preferably is deposited at a pressure between about 1.8 and 3.2 Torr and more preferably at a pressure between about 2.1 and 2.8 torr. The PE-OX layer 32 can be deposited at a temperature between 380° and 420° C. The PE-OX is deposited at a RF power of between 200 and 230 watts. The gap spacing is between 300 and 420 mils. Conventional plasma deposition equipment can be used, such as, an AMAT depositor, model P-5000. Preferably, a silicon oxide layer 32 composed of PE-Ox is formed by a plasma enhance deposition of silicon oxide at a pressure of about 2.5 torrs, a rf power of about 230 watts, at a temperature of about 400° C., with an electrode spacing of about 390 mils, with a $SiH_4$ flow of about 90 sccm, and a $N_2O$ flow rate of about 1800 sccm.

The silicon oxide layer 32 is preferably formed of silicon oxide using a PECVD process and TEOS— (Tetraethylorthosilicate) preferably using an $O_2$ flow rate in a range of about 900 and 1100 mgm and more preferably about 1000 mgm; a TEOS flow range of 900 and 1100 mgm and more preferably about 1000 mgm; a $N_2$ flow in a range of about 900 and 1100 mgm and more preferably about 1000 mgm; a servo pressure ring a range of about 7.2 to 9.2 torr and more preferably about 8.2 torr; a deposition temperature in a range of about 390° to 410° C. and more preferably about 400° C., and a rf power in a range of about 650 and 775 W and more preferably about 725 W and a gap spacing in a range of about 220 and 280 mils and more preferably about 250 mils.

The silicon oxide layer 28, within the thickness range specified above, provides a stress buffer between the underlying metal 20 and first silicon nitride layer 24 and for the next overlying layer SiN layer 32. This stress buffer improves the reliability of the moisture barrier 24 28 32 over the metal lines.

Subsequently, a second nitride layer 32 is formed over the silicon oxide layer 28. The second nitride layer preferably has a thickness in a range of between about 4000 and 7000 Å. The second nitride layer 32 is preferably formed using a plasma enhanced chemical vapor deposition process. The second silicon nitride layer can be formed using the same PECVD processes as used to form the first silicon nitride layer 24.

The second silicon nitride (SiN) layer 32 is preferably formed using a plasma enhanced chemical vapor deposition (PECVD) process. A first silicon nitride layer 32 composed of a plasma enhanced silicon nitride (PE-SiN) layer can be formed by reacting silane and ammonia in an argon plasma or by reacting silane and ammonia in a nitrogen discharge. Preferably, the plasma enhanced silicon nitride layer (PE-SN) is formed in an argon plasma. The flow rates of silane are between 200 and 300 sccm and of ammonia between 50 and 120 sccm and $N_2$ flow rate of between about 3000 and 4000 sccm. The PE-SN is deposited at a pressure between 4.0 and 6.0 mTorr. The PE-SN layer 18 can be deposited at a temperature between 380° and 420° C. The PE-SN is deposited at a power of between 680 and 420 watts. The electrode gap spacing is between 580 and 620 mils. Conventional plasma deposition equipment can be used, such as, an AMAT depositor, model P-5000 by Applied Materials Company.

In the first preferred embodiment, the passivation layer 24 28 32 are formed over a top metal layer 20 (the uppermost metal layer over a wafer) as shown in FIG. 2. Next, an insulating layer 36 is formed over the second nitride layer 32. The insulating layer is preferably composed of a material selected from the group consisting of: Polyimide (PI) and epoxy; such as a fused silica filler epoxy. The insulating layer can comprise one or more layers.

The passivation layer structure 24 28 32 of the present invention provides good step coverage, a good moisture barrier and stress reduction. Each of the three layer contributes to the passivation structures overall performance and each layers is specially tuned to create a synergy with the other passivation layers produced with the preferred processes and at the preferred thicknesses. The first silicon nitride layer forms a good moisture barrier at the lower corners 25 near the bottom of the metal lines 20 and at the upper corners. The conformal nature of the plasma enhanced process and the thin PE-SiN layer provide the good moisture barrier properties and good step coverage. The good moisture barrier properties of layer 24 eliminate corrosion of the metal layers. The first SiN layer, at the specified thickness ranges, also reduces stress between the metal lines, first and second SiN layers 24 32. In addition, the thin PE-SiN layer protects the metal lines from plasma damage from the overlying plasma enhance silicon oxide layer 28 (e.g., PE-TEOS). The silicon oxide layer 28 is more preferably formed of PE-TEOS since it is superior to PE-OX because it provides better step coverage.

The silicon oxide layer 28, with the thickness specified above, provides a stress buffer between the underlying metal 20 and first silicon nitride layer 24 and for the next overlying layer SiN layer 32. This stress buffer helps form a good moisture barrier over the metal lines. Moreover, the second silicon nitride layer 32 protects the circuit from scratches.

While the invention has been particularly shown and described with reference to the preferred embodiments thereof, it will be understood by those skilled in the art that various changes in form and details may be made without departing from the spirit and scope of the invention.

What is claimed is:

1. A method of fabricating passivation layers over spaced metal lines over a semiconductor structure, comprising:
   a) forming said spaced metal lines over said semiconductor structure; said metal lines have height in a range of about 0.4 and 0.8 µm, a width in a range of about 0.5 and 1.5 µm, and a spacing in a range of about 0.5 and 1.0 µm;
   b) forming a first silicon nitride layer, using a first plasma enhanced chemical vapor deposition process, on said metal lines and said semiconductor structure, said first silicon nitride layer having a first thickness in a range of about 900 and 1000 Å;
   c) forming a silicon oxide layer on said first silicon nitride layer, said silicon oxide layer having second thickness in a range of between about 4000 and 9000 Å; said silicon oxide layer formed using a second plasma enhanced chemical vapor deposition process and TEOS using an $O_2$ flow rate in a range of about 900 and 1100 mgm; a TEOS flow range of 900 and 1100 mg per min; a $N_2$ flow in a range of about 900 and 1100 mg per min; a pressure in a range of about 7.2 and 9.2 torr; a deposition temperature in a range of about 390° and 410° C.; and a rf power in a range of about 650 and 775 W and an electrode gap spacing in a range of about 220 and 280 mils;
   d) forming a second nitride layer, using a third plasma enhanced chemical vapor deposition process, on said silicon oxide layer, said second nitride layer having a third thickness in a range of between about 4000 and 7000 Å.

2. The method of claim 1 wherein said spaced metal lines are the uppermost metal layer over the semiconductor structure; and forming an insulating layer is formed over said second nitride layer; said insulating layer composed of a material selected from the group consisting of: polyimide and epoxy.

3. The method of claim 1 wherein said first silicon nitride layer is formed using said first plasma enhanced chemical vapor deposition process with an argon plasma, with a silane ($SiH_4$) flow rate between about 200 and 300 sccm, and an ammonia flow rate between about 50 and 120 sccm and $N_2$ flow rate between about 3000 and 4000 sccm, deposited at a pressure between 4.0 and 6.0 Torr, at a temperature between 380° and 420° C., at a power of between 680 and 740 watts and a electrode gap spacing is between 580 and 620 mils.

4. A method of fabricating passivation layers over spaced metal lines over a semiconductor structure, comprising:
   a) forming said spaced metal lines over said semiconductor structure; said spaced metal lines have a spacing of between about 0.5 and 1.0 µm;
   b) forming a first silicon nitride layer, using a first plasma enhanced chemical vapor deposition process, on said metal lines and said semiconductor structure, said first silicon nitride layer having a first thickness in a range of about 900 and 1000 Å; said first silicon nitride layer is formed using said first plasma enhanced chemical vapor deposition process with an argon plasma, with a silane (SiH$_4$) flow rate between about 200 and 300 sccm, and an ammonia flow rate between about 50 and 120 sccm and N$_2$ flow rate between about 3000 and 4000 sccm, deposited at a pressure between 4.0 and 6.0 Torr, at a temperature between 380° and 420° C., at a power of between 680 and 740 watts and an electrode gap spacing is between 580 and 620 mils;

c) forming a silicon oxide layer on said first silicon nitride layer, said silicon oxide layer having a second thickness in a range of between about 4000 and 9000 Å; said silicon oxide layer formed using a second plasma enhanced chemical vapor deposition (PECVD) process and tetraethoxysilane (TEOS);

d) forming a second nitride layer, using a third plasma enhanced chemical vapor deposition process, on said silicon oxide layer, said second nitride layer having a third thickness in a range of between about 4000 and 7000 Å.

\* \* \* \* \*